(12) United States Patent
Iwase et al.

(10) Patent No.: US 9,670,370 B2
(45) Date of Patent: Jun. 6, 2017

(54) FUNCTIONAL FILM MANUFACTURING METHOD AND FUNCTIONAL FILM

(71) Applicant: FUJIFILM Corporation, Tokyo (JP)

(72) Inventors: Eijiro Iwase, Kanagawa (JP); Jiro Tsukahara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 560 days.

(21) Appl. No.: 14/157,814

(22) Filed: Jan. 17, 2014

(65) Prior Publication Data

US 2014/0178700 A1   Jun. 26, 2014

Related U.S. Application Data

(63) Continuation of application No. PCT/JP2012/069338, filed on Jul. 30, 2012.

(30) Foreign Application Priority Data

Aug. 1, 2011 (JP) ................. 2011-168360

(51) Int. Cl.
*C09D 7/12* (2006.01)
*B05D 1/36* (2006.01)
(Continued)

(52) U.S. Cl.
CPC ............. *C09D 7/1233* (2013.01); *B05D 1/36* (2013.01); *B05D 7/04* (2013.01); *B05D 7/24* (2013.01);
(Continued)

(58) Field of Classification Search
None
See application file for complete search history.

(56) References Cited

U.S. PATENT DOCUMENTS

2006/0251905 A1   11/2006   Arakawa
2009/0169906 A1   7/2009    Aiba
(Continued)

FOREIGN PATENT DOCUMENTS

JP   2001125079 A   5/2001
JP   2002205354 A   7/2002
(Continued)

OTHER PUBLICATIONS

Extended European Search Report, issued by the European Patent Office on Apr. 8, 2016 in connection with European Patent Application No. 12820068.0.
(Continued)

*Primary Examiner* — Erma Cameron
(74) *Attorney, Agent, or Firm* — Edwards Neils LLC; Jean C. Edwards, Esq.

(57) ABSTRACT

The present invention relates to a functional film and a method for manufacturing the same, the functional film being organically and inorganically laminated to have a desired function such as high gas barrier performance and having high adhesiveness between inorganic and organic layers. The organic layer on top of the inorganic layer contains an organic solvent; an organic compound formed of the organic layer; and a silane coupling agent with a concentration between 0.1 and 25 percentages by mass excluding the organic solvent, the organic layer uses a coating material not containing a pH controller, and the organic layer is formed through curing via a heating process after coating.

8 Claims, 2 Drawing Sheets

(51) Int. Cl.
| | |
|---|---|
| *H05B 33/04* | (2006.01) |
| *B05D 7/24* | (2006.01) |
| *B05D 7/04* | (2006.01) |
| *B05D 7/00* | (2006.01) |
| *C23C 16/34* | (2006.01) |
| *C23C 16/54* | (2006.01) |
| *C08J 7/04* | (2006.01) |
| *H01L 51/52* | (2006.01) |
| *B05D 3/04* | (2006.01) |
| *B05D 3/06* | (2006.01) |

(52) U.S. Cl.
CPC ............... *B05D 7/56* (2013.01); *C08J 7/047* (2013.01); *C23C 16/345* (2013.01); *C23C 16/545* (2013.01); *H05B 33/04* (2013.01); *B05D 3/0406* (2013.01); *B05D 3/06* (2013.01); *B05D 2252/02* (2013.01); *C08J 2433/06* (2013.01); *H01L 51/5256* (2013.01); *Y10T 428/31663* (2015.04)

(56) References Cited

U.S. PATENT DOCUMENTS

| | | | |
|---|---|---|---|
| 2009/0305064 A1* | 12/2009 | Tsukahara | C08J 7/045 428/447 |
| 2010/0323168 A1 | 12/2010 | Nagahara et al. | |
| 2011/0052891 A1 | 3/2011 | Takahashi et al. | |
| 2012/0052272 A1* | 3/2012 | Iwase | C08J 7/045 428/213 |

FOREIGN PATENT DOCUMENTS

| | | |
|---|---|---|
| JP | 2005007741 A | 1/2005 |
| JP | 2006-291179 A | 10/2006 |
| JP | 2006289627 A | 10/2006 |
| JP | 2008-222777 A | 9/2008 |
| JP | 2009154473 A | 7/2009 |
| JP | 2010173134 A | 8/2010 |
| JP | 2011046060 A | 3/2011 |
| WO | WO 2009/107768 A1 | 9/2009 |
| WO | 2012/003198 A2 | 1/2012 |

OTHER PUBLICATIONS

Notification of Reasons for Refusal issued by the Japanese Patent Office (JPO) on Jun. 23, 2015 in connection with corresponding Japanese Patent Application No. 2011-168360.
Second Office Action issued by the State Intellectual Property Office (SIPO) of China on Jul. 16, 2015 in connection with Chinese Patent Application No. 201280038000.X.
Office Action issued by the Korean Intellectual Property Office (KIPO) on Jul. 20, 2015 in connection with Korean Patent Application No. 10-2014-7002747.
Notification of Reasons for Refusal issued by the Japanese Patent Office on Sep. 30, 2014 in connection with Japanese Patent Application No. 2011-168360.
International Preliminary Report on Patentability issued on Feb. 13, 2014 in connection with priority application PCT/JP2012/069338.
Office Action issued by SIPO on Dec. 3, 2014 in connection with corresponding Chinese Patent Application No. 201280038000.X.
International Search Report issued in PCT/JP2012/069338 on Nov. 6, 2012.
Office Action issued by the European Patent Office on Mar. 23, 2017 in connection with European Patent Application No. 12820068.0.

* cited by examiner

FUNCTIONAL FILM MANUFACTURING METHOD AND FUNCTIONAL FILM

CROSS-REFERENCE TO RELATED APPLICATIONS

This application is a continuation application of International Application No. PCT/JP2012/069338, filed Jul. 30, 2012, which was published under PCT Article 21(2) in Japanese, which is based upon and claims the benefit of priority from Japanese Application No. 2011-168360 filed on Aug. 1, 2011, the contents of all of which are incorporated by reference herein in their entirety.

BACKGROUND OF THE INVENTION

The present invention relates to a method of manufacturing a functional film such as a gas barrier film including organic layers and inorganic layers alternately formed on a support, and the functional film.

Gas barrier films are used in, for example, portions or parts requiring moisture resistance in various devices including optical devices, display devices such as liquid-crystal displays and organic EL displays, various semiconductor devices and solar cells, and packaging materials for packaging food, electronic components, etc.

A gas barrier film is generally configured to include a layer exhibiting gas barrier properties (hereinafter also referred to as "gas barrier layer") formed on a plastic film such as a polyethylene terephthalate (PET) film serving as a support (substrate). For example, a layer made of any of various inorganic compounds such as silicon nitride, silicon oxide and aluminum oxide is known as the gas barrier layer that may be used in a gas barrier film.

Of such gas barrier films, a gas barrier film having a laminated structure in which organic layers each made of an organic compound (organic compound layers) and inorganic layers each made of an inorganic compound (inorganic compound layers) are alternately formed on a support is also known as a configuration capable of obtaining higher gas barrier performance. The gas barrier film having a laminated structure of organic layers and inorganic layers is also hereinafter referred to as "organic/inorganic laminate type gas barrier film."

For example, JP 2001-125079 A describes a gas barrier film (substrate for a transparent electrode) including an organic layer made of an epoxy acrylic resin containing a silane coupling agent and formed on a polymer film base, an inorganic layer (gas barrier layer) made of silicon oxide or the like and formed on the organic layer, and an organic layer (protective coat layer) made of an acrylic resin containing a silane coupling agent and formed on the inorganic layer.

In a general configuration, such an organic/inorganic laminate type gas barrier film usually includes an organic layer serving as the primer coating (undercoat layer) on a support and further includes an organic layer serving as the protective layer in the uppermost layer, as in the example described in JP 2001-125079 A.

Not only a gas barrier film like that shown in JP 2001-125079 A configured to have only one inorganic layer between the primer coating and the protective layer, but also a gas barrier film configured to include alternately formed inorganic layers and organic layers on a primer coating and to have the uppermost organic layer serve as the protective layer is also known. In other words, a gas barrier film configured to include, on the organic layer as the primer coating, a plurality of combinations each composed of an inorganic layer and its overlying organic layer, and to have the uppermost organic layer serve as the protective layer is also known.

It is the inorganic layer that mainly exhibits gas barrier properties in such an organic/inorganic laminate type gas barrier film. In the organic/inorganic laminate type gas barrier film, an inorganic layer is formed on an organic layer to planarize the formation surface for the inorganic layer owing to the organic layer and the inorganic layer is formed while keeping the flatness of the organic layer, whereby the inorganic layer formed is uniform and has no cracks or breaks, and excellent gas barrier performance is obtained.

It is also known that more excellent gas barrier performance is obtained in the organic/inorganic laminate type gas barrier film by having a plurality of combinations each composed of an organic layer and an inorganic layer.

However, in the organic/inorganic laminate type gas barrier film, it is difficult to ensure sufficient adhesion between an inorganic layer and its overlying organic layer.

The inorganic layer (inorganic film) is generally formed by vapor-phase deposition processes such as plasma CVD and sputtering. The film obtained by such vapor-phase deposition processes is compact. Since the inorganic layer is compact, the organic layer formed on the inorganic layer does not permeate unlike the application to a so-called readily adhering layer, so a so-called anchoring effect cannot be obtained and sufficient adhesion cannot be ensured.

Therefore, in the formation of an organic layer on an inorganic layer in an organic/inorganic laminate type gas barrier film, a silane coupling agent is added to the coating material for forming the organic layer as also described in JP 2001-125079 A.

As a result of the addition of the silane coupling agent to the coating material, covalent bonds are formed between the silane coupling agent and the underlying inorganic layer, and the organic compound is bonded to the silane coupling agent inside the organic film by a copolymerization reaction or the like. Strong adhesion can be thus obtained between the inorganic layer and its overlying organic layer.

SUMMARY OF THE INVENTION

However, the addition of the silane coupling agent to the organic layer overlying the inorganic layer also has various problems.

As is well known, the reaction of a silane coupling agent proceeds through hydrolysis of a hydrolyzable group such as an alkoxy group. The pH is to be appropriately adjusted in order for the hydrolysis to proceed, and a pH adjuster (an acid or an alkali) is added dropwise to control the pH.

Even if the pH is appropriately controlled, the dropwise addition of the pH adjuster to the coating material containing the silane coupling agent causes the hydrolysis to proceed due to the humidity of a production environment or water supply from an organic solvent. The hydrolysis proceeds to increase the viscosity of the coating material with time. As a result, of appropriate coating conditions in the coating step, the viscosity of the coating material departs from an appropriate viscosity range, and defective coating or the like is more likely to occur.

JP 2001-125079 A describes that the acrylic resin making up the organic layer preferably has an acid number of 1 to 4 in order to suppress such unnecessary progress of hydrolysis.

In the coating material containing the silane coupling agent added thereto, the hydrolysis in the coating material causes an alcohol to be produced as a by-product. In addition, if the silane coupling agent is added in an excess amount, the silane coupling agent remains in the coating material as an unreacted substance.

The alcohol produced as a by-product and the silane coupling agent remaining unreacted become factors which inhibit curing (photopolymerization reaction) of an organic compound upon formation of an organic layer. Therefore, these substances become factors which increase the curing time and thereby reduce the productivity.

What is more, as described above, the inorganic layer is formed by vapor-phase deposition processes (vacuum deposition processes) such as plasma CVD and sputtering.

If the alcohol produced as a by-product and the unreacted silane coupling agent remain in the organic layer as described above in further forming the inorganic layer on the organic layer, large amounts of gases are released from the organic layer by heating under reduced pressure in the formation of the inorganic layer. As a result, factors occur which impede the formation of a compact inorganic layer, such as pressure variations in the film forming space for the inorganic layer and destabilized plasma, thus causing problems including the reduction in gas barrier performance of the prepared gas barrier film.

The present invention aims at providing a functional film manufacturing method capable of ensuring, in a functional film such as an organic/inorganic laminate type gas barrier film including organic layers and inorganic layers alternately formed on a support (substrate), sufficient adhesion between an organic layer and its underlying inorganic layer by incorporating a silane coupling agent in the organic layer, and capable of consistently manufacturing a high-performance functional film by suppressing an increase in the coating material viscosity due to unnecessary hydrolysis of the silane coupling agent and deterioration of the gas barrier performance due to the silane coupling agent added in an excess amount or an alcohol produced as a by-product; and the functional film obtained by the manufacturing method.

In order to achieve the above object, the present invention provides a functional film manufacturing method for manufacturing a functional film having a support, and two or more organic layers and one or more inorganic layers alternately formed on the support, the method comprising: a step of forming an organic layer by a coating process and a step of forming an inorganic layer of a silicon compound by a vapor-phase deposition process, and upon formation of an organic layer overlying an inorganic layer, further comprising a step of exposing a surface of the inorganic layer to air prior to the formation of the organic layer, wherein the organic layer overlying the inorganic layer is formed using a coating material containing an organic solvent, an organic compound for forming the organic layer, and a silane coupling agent in an amount of 0.1 to 25 wt % in terms of concentration in the coating material exclusive of the organic solvent and containing no pH adjuster by applying the coating material onto the surface of the inorganic layer and subjecting the coating material on the inorganic layer to heating treatment and drying at a higher temperature than an azeotropic point of a by-product due to the silane coupling agent and the organic solvent or at a higher temperature than a higher one of boiling points of the by-product and the organic solvent, then curing the organic compound.

In the functional film manufacturing method of the invention as described above, the heating treatment is preferably performed by heating the support from a side on which the organic layer and the inorganic layer are formed and a side on which the organic layer and the inorganic layer are not formed.

Preferably, the heating treatment and the drying of the coating material are performed simultaneously.

The coating material used for the formation of the organic layer overlying the inorganic layer preferably contains as the organic compound an organic compound having a higher glass transition temperature than the azeotropic point or the higher one of the boiling points of the by-product and the organic solvent.

The coating material preferably contains, as the organic compound for forming the organic layer, either or both of a trifunctional or higher (meth)acrylate monomer and a trifunctional or higher (meth)acrylate oligomer in an amount of 50 wt % or more in terms of the concentration in the coating material exclusive of the organic solvent.

The organic compound is preferably cured by either or both of ultraviolet light irradiation and electron beam irradiation.

The heating treatment is preferably performed by one or more of hot air heating, heating with a heating roller and heating with a heat exchanger plate.

Preferably, the support is in strip form and is let out from a support roll having the support wound into a roll, application of the coating material to the support, the heating treatment and the drying of the coating material, and curing of the organic compound are performed as the let-out support is conveyed in its longitudinal direction, thereby forming an organic layer, and the support having the organic layer formed thereon is rewound into a roll.

The present invention also provides a functional film comprising a support, and two or more organic layers and one or more inorganic layers alternately formed on the support, wherein the inorganic layers are silicon compound layers and an organic layer overlying an inorganic layer contains a silane coupling agent in an amount of 0.1 to 25 wt % and contains no pH adjuster.

In the functional film of the invention as described above, the organic layers preferably contain an ingredient obtained by polymerizing either or both of a trifunctional or higher (meth)acrylate monomer and a trifunctional or higher (meth) acrylate oligomer in an amount of 50 wt % or more.

The organic layers preferably include an organic layer formed on a surface of the support and an organic layer formed as an uppermost layer.

The functional film preferably includes a plurality of combinations each composed of an inorganic layer and an organic layer overlying the inorganic layer.

The invention configured as described above relates to an organic/inorganic laminate type functional film in which organic layers and inorganic layers are alternately formed. According to the invention, an organic layer formed on an inorganic layer in such an organic/inorganic laminate type functional film is formed using a coating material which contains a silane coupling agent in a predetermined amount but contains no pH adjuster. Furthermore, the organic layer formed on the inorganic layer is formed by applying the coating material and allowing the reaction of the silane coupling agent to proceed through heating treatment.

Accordingly, the invention is capable of obtaining a high-performance functional film such as a gas barrier film having high gas barrier performance which includes an organic layer having excellent adhesion to its underlying inorganic layer and formed using an appropriate coating material in which hydrolysis of a silane coupling agent does not unnecessarily proceed, the inorganic layer formed being compact.

BRIEF DESCRIPTION OF THE DRAWINGS

FIG. 2A showing a device for forming an organic layer and FIG. 2B showing a device for forming an inorganic layer.

DETAILED DESCRIPTION OF THE INVENTION

The functional film manufacturing method and the resulting functional film according to the invention are described below in detail with reference to the preferred embodiments shown in the accompanying drawings.

The functional film of the invention includes two or more organic layers and one or more inorganic layers which are alternately formed on a support. An organic layer formed on an inorganic layer contains a silane coupling agent in an amount of 0.1 to 25 wt % but contains no pH adjuster.

The functional film of the invention as described above is basically manufactured by the functional film manufacturing method of the invention.

Figure 1A:
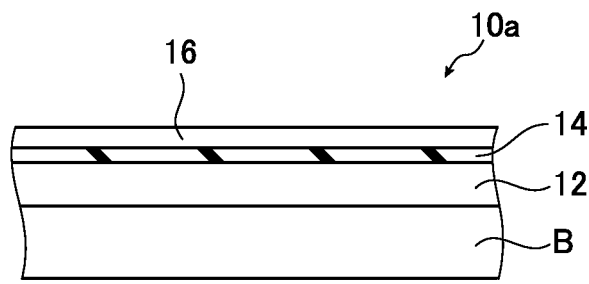
FIGS. 1A to 1C are views conceptually showing examples of a functional film manufactured by a manufacturing method of the invention.

FIG. 1A conceptually shows an example of a gas barrier film making use of the functional film of the invention.

The functional film and the method of manufacturing the functional film according to the invention are not limited to the gas barrier film and the method of manufacturing the gas barrier film, respectively. In other words, the invention can be applied to various known functional films having desired functions, including various optical films such as optical filters and antireflection films. However, as will be described later, the invention can considerably reduce adverse effects of a by-product such as an alcohol due to a silane coupling agent remaining in the organic layer to form a compact inorganic layer. Therefore, the invention is advantageously used in a gas barrier film in which the compactness of the inorganic layer significantly contributes to the performance.

A gas barrier film 10a shown in FIG. 1A includes an organic layer 12 formed on (a surface of) a support B, an inorganic layer 14 formed on the organic layer 12 and a protective organic layer 16 which is an organic layer formed on the inorganic layer 14 and serving as a protective layer.

The gas barrier film (functional film) of the invention is not limited to the illustrated case which is configured to sandwich one inorganic layer between two organic layers and includes in total three layers, i.e., the organic layers and the inorganic layer alternately formed on the support B.

In other words, various layer configurations are available if the gas barrier film of the invention is configured to include two or more organic layers and one or more organic layers which are alternately formed. Therefore, a configuration having two or more combinations each composed of an organic layer and an inorganic layer may be applied. In particular, the layer configuration in which an organic layer serving as the primer coating is formed on a surface of the support B and an organic layer serving as the protective layer is formed in the uppermost layer is advantageously used irrespective of the number of the organic layer/inorganic layer combinations in such aspects as the performance and strength of the gas barrier film.

Figure 1B:
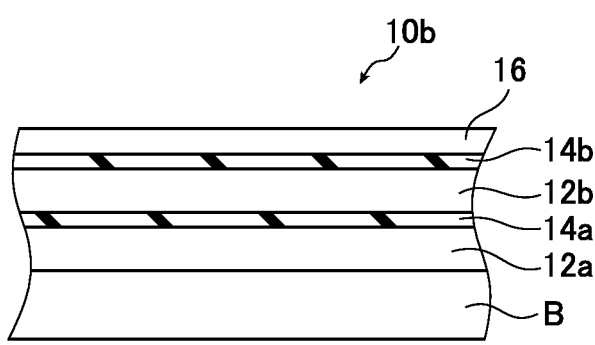

A preferred example of the gas barrier film of the invention includes a gas barrier film 10b as shown in FIG. 1B which includes an organic layer 12a on a surface of a support B, an inorganic layer 14a on the organic layer 12a, an organic layer 12b on the inorganic layer 14a, an inorganic layer 14b on the organic layer 12b, and a protective organic layer 16 as the uppermost organic layer. In brief, the preferred example of the gas barrier film of the invention is the gas barrier film 10b which includes in total five layers and in which the organic layers and the inorganic layers are alternately formed on the support B.

Figure 1C:
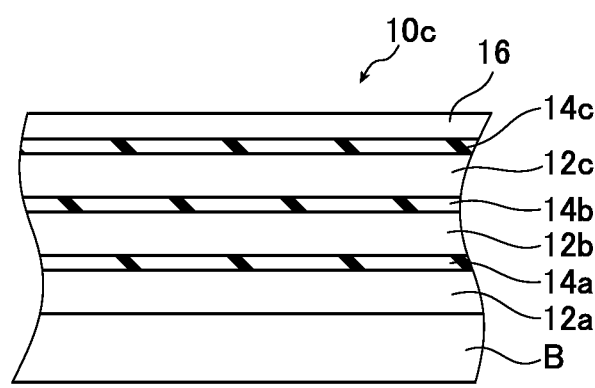

Another preferred example of the gas barrier film of the invention includes a gas barrier film 10c as shown in FIG. 1C which includes an organic layer 12a on a surface of a support B, an inorganic layer 14a on the organic layer 12a, an organic layer 12b on the inorganic layer 14a, an inorganic layer 14b on the organic layer 12b, an organic layer 12c on the inorganic layer 14b, an inorganic layer 14c on the organic layer 12c, and a protective organic layer 16 as the uppermost organic layer. In brief, the preferred example of the gas barrier film of the invention is the gas barrier film 10c which includes in total seven layers and in which the organic layers and the inorganic layers are alternately formed on the support B.

Still another preferred example is a gas barrier film which includes in total nine or more layers and in which organic layers and inorganic layers are alternately formed. Basically, in terms of gas barrier performance, a more excellent gas barrier film is obtained with increasing number of combinations each composed of an organic layer and an inorganic layer.

According to the invention, the support (substrate/base) B is not particularly limited and various known sheets used for the support of gas barrier films can be utilized.

The support B in a long sheet shape (support B in web form) is preferably used so that organic layers and inorganic layers can be formed by a roll-to-roll system to be described later.

Specific examples of the support B that may be advantageously used include plastic films made of various plastics (polymer materials) such as polyethylene terephthalate (PET), polyethylene naphthalate (PEN), polyethylene, polypropylene, polystyrene, polyamide, polyvinyl chloride, polycarbonate, polyacrylonitrile, polyimide, polyacrylate, and polymethacrylate.

The support B may be the one in which layers (films) for obtaining various functions, such as a protective layer, an adhesion layer, a light reflection layer, an antireflection layer, a light-shielding layer, a planarizing layer, a buffer layer, and a stress-relief layer are formed on a surface of any of the plastic films described above.

In the gas barrier film 10a (10b, 10c), the organic layer 12 (12a) formed on the surface of the support B is a layer made of an organic compound (layer (film) primarily composed of an organic compound) and is obtained by curing a monomer or oligomer of the organic compound through polymerization (cross-linking).

In the gas barrier film 10a of the invention, the organic layer 12 formed on, for example, the surface of the support B as the layer underlying the inorganic layer 14 (14a-14c) basically acts as the primer coating for the inorganic layer 14 exhibiting the gas barrier properties (desired function). By forming the inorganic layer 14 on the organic layer 12 serving as the primer coating, the formation surface for the inorganic layer 14 is planarized and the thus formed inorganic layer 14 is uniform and has no cracks, breaks or voids including unformed portions (has considerably reduced voids), whereby a gas barrier film exhibiting the desired gas barrier performance can be consistently manufactured.

In the manufacturing method of the invention, the formation material of the organic layer 12 formed on the surface of the support B is not particularly limited and various known organic compounds (resins/polymer materials) can be used.

More specifically, preferred examples thereof include films made of thermoplastic resins such as polyester, acrylic resin, methacrylic resin, methacrylic acid-maleic acid copolymer, polystyrene, transparent fluororesin, polyimide, fluorinated polyimide, polyamide, polyamide-imide, polyetherimide, cellulose acylate, polyurethane, polyether ether ketone, polycarbonate, alicyclic polyolefin, polyarylate, polyethersulfone, polysulfone, fluorene ring-modified polycarbonate, alicyclic ring-modified polycarbonate, fluorene ring-modified polyester, and acryloyl compound; polysiloxane and other organosilicon compounds.

Of these, the organic layer 12 formed of a polymerization product of a radical polymerizable compound and/or a cationic polymerizable compound having ether group as a functional group is preferable because such organic layer planarizes the formation surface for the inorganic layer 14 so as to allow the inorganic layer 14 to sufficiently exhibit its function, and has an excellent heat resistance.

In particular, acrylic resins and methacrylic resins primarily composed of polymers of acrylate and/or methacrylate monomers or oligomers are suitably used for the organic layer 12 because they are also excellent in strength and optical properties.

As described above, in the manufacturing method of the invention, the organic layer 12 underlying the inorganic layer 14 basically functions as the primer coating for appropriately forming the inorganic layer 14.

Therefore, the thickness of the organic layer 12 may be appropriately set so that this purpose can be achieved. In particular, according to the study made by the inventors of the invention, the organic layer 12 preferably has a thickness of 500 to 3,000 nm.

The inorganic layer 14 (14a-14c) is a silicon compound layer (layer (film) primarily composed of a silicon compound). In the illustrated gas barrier film 10a (10b and 10c), the inorganic layer 14 mainly exhibits a desired function, i.e., gas barrier properties.

The formation material of the inorganic layer 14 is not particularly limited and a variety of silicon compounds exhibiting gas barrier properties can be used.

Specific examples of the films that may suitably be used include those made of inorganic compounds including silicon oxides such as silicon oxide, silicon oxynitride, silicon oxycarbide, silicon oxynitrocarbide; silicon nitrides such as silicon nitride and silicon nitrocarbide; silicon carbides such as silicon carbide; hydrides thereof; mixtures of two or more thereof; and hydrogen-containing types thereof.

In particular, silicon nitride, silicon oxide and silicon oxynitride are used with advantage because excellent gas barrier performance can be obtained.

When the protective organic layer 16 (the organic layer 12b, 12c or the like) is to be formed as the overlying layer, —O group or —OH group is introduced to the surface of the inorganic layer 14.

This point will be described later in further detail.

In cases where the invention is applied to a functional film other than the gas barrier film, the inorganic layer 14 may be formed by appropriately selecting a silicon compound exhibiting a desired function, for example, a predetermined refractive index or filtering properties that allow light in a predetermined wavelength band to be transmitted but light in the other wavelength band to be blocked.

The functional film of the invention is not limited to the one in which the inorganic layer 14 mainly exhibits the desired function but the desired function of the functional film may be exhibited by the combination of the organic layer 12 with the inorganic layer 14.

In cases where a plurality of inorganic layers 14 are included in the invention, the respective inorganic layers 14 may be the inorganic layers 14 which are all made of the same material (silicon compound). Alternatively, the inorganic layers 14 may include two or more inorganic layers 14 made of mutually different materials, or be made of materials different from each other.

According to the invention, the thickness of the inorganic layer 14 is not particularly limited. That is, the thickness of the inorganic layer 14 may be appropriately determined according to the formation material so that the desired gas barrier properties (function) can be exhibited. In particular, the inorganic layer 14 preferably has a thickness of 15 to 200 nm.

The inorganic film 14 exhibiting a sufficient function in a consistent manner can be formed by adjusting the thickness of the inorganic layer 14 to 15 nm or more. The inorganic layer 14 is generally brittle and may cause breaks, cracks or delamination when it is too thick. However, breaks can be prevented from occurring by adjusting the thickness of the inorganic layer 14 to 200 nm or less.

In consideration of this point, the inorganic layer 14 preferably has a thickness of 15 to 100 nm and particularly 20 to 75 nm.

In a preferred embodiment, the functional film 10a has the protective organic layer 16 for mainly protecting the inorganic layer 14 or the like which is formed uppermost, as the uppermost layer (the outermost layer opposite from the support, i.e., the layer farthest from the support).

As is well known, the inorganic layer 14 is generally brittle and thin. Therefore, in the gas barrier film 10a in which the organic layer 12 and the inorganic layer 14 are alternately formed, and the like, the protective organic layer 16 serving as the protective layer is formed in the uppermost layer to protect the inorganic layer 14 which is prone to breakage, whereby processing such as roll-to-roll processing to be described later or cutting can be performed in a consistent manner.

According to the invention, the protective organic layer 16 and, additionally, an organic layer formed on the inorganic layer 14, such as the organic layer 12b in the gas barrier film 10b of FIG. 1B and the organic layers 12b and 12c in the gas barrier film 10c of FIG. 1C, contain a silane coupling agent in an amount of 0.1 to 25 wt % but do not contain a pH adjuster.

This point will be described later in further detail.

Organic layers formed on inorganic layers, such as the protective organic layer 16 as well as the organic layers 12b and 12c formed on their corresponding inorganic layers 14, are basically the identical layers to be formed in a specified order. Therefore, the protective organic layer 16 is taken as a typical example in the following description.

According to the invention, various layers each formed of the same type of organic compound as the above-described organic layer 12 may be used for the protective organic layer 16.

A layer formed of a polymerization product of a radical polymerizable compound and/or a cationic polymerizable compound having ether group as a functional group is suitable for the protective organic layer 16 in terms of heat resistance in heating treatment to be described later.

In particular, acrylic resins and methacrylic resins primarily composed of polymers of acrylate and/or methacrylate monomers or oligomers are suitably used for the protective organic layer 16 in terms of not only the above heat resistance but also low refractive index and excellent optical properties.

More specifically, acrylic resins and methacrylic resins primarily composed of polymers of acrylate and/or methacrylate monomers or oligomers having two or more functional groups such as dipropylene glycol di(meth)acrylate (DPGDA), 1,9-nonanediol di(meth)acrylate (A-NOD-N), 1,6-hexanediol diacrylate (A-HD-N), trimethylol propane tri(meth)acrylate (TMPTA), (modified) bisphenol A di(meth)acrylate, and dipentaerythritol hexa(meth)acrylate (DPHA) are preferred.

Among others, an ingredient obtained by polymerizing a trifunctional or higher acrylate monomer or oligomer is preferably included in an amount of 50 wt % or more and particularly 70 wt % or more.

The thickness of the protective organic layer 16 is not particularly limited and may be the same as that of the above-described organic layer 12.

Figure 2A:
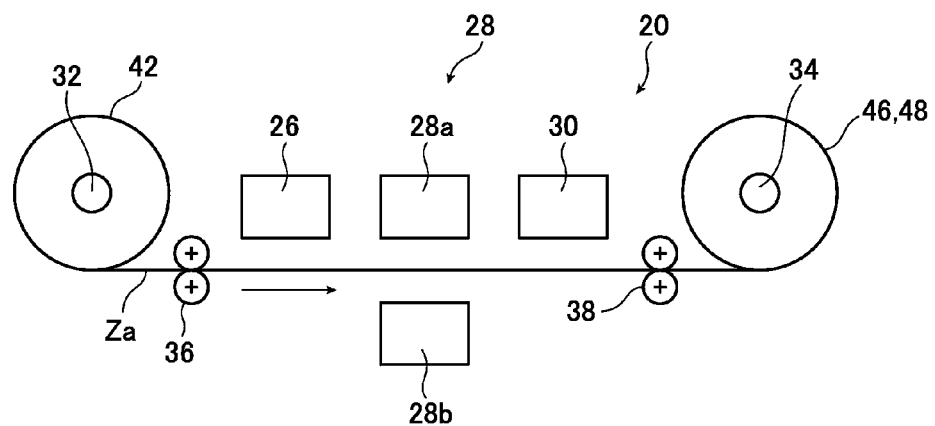
FIGS. 2A and 2B conceptually show an example of a manufacturing apparatus for implementing the functional film manufacturing method of the invention.
Figure 2B:
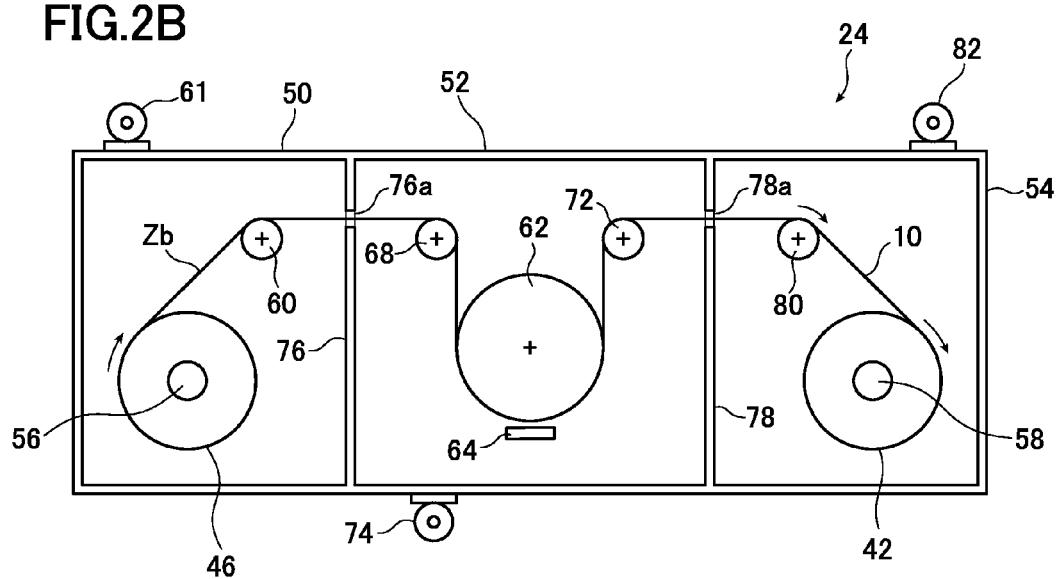

FIGS. 2A and 2B conceptually show an example of a manufacturing apparatus for implementing the functional film manufacturing method of the invention.

The manufacturing apparatus includes an organic film forming device 20 for forming the organic layer 12 and the protective organic layer 16 (the organic layers 12a to 12c) and an inorganic film forming device 24 for forming the inorganic layer 14 (the inorganic layers 14a to 14c). FIG. 2A shows the organic film forming device 20 and FIG. 2B shows the inorganic film forming device 24.

The organic film forming device 20 and the inorganic film forming device 24 shown in FIGS. 2A and 2B are both so-called roll-to-roll (hereinafter also abbreviated as RtoR) film forming devices in each of which a film forming material in strip form (film forming material in web form) is fed out from a material roll having the film forming material wound into a roll, a film is formed on the film forming material as the material is conveyed in the longitudinal direction, and the film forming material having the film formed thereon is rewound into a roll.

In the manufacturing method of the invention, according to a preferred embodiment, a functional film can be efficiently manufactured by making use of such RtoR.

The manufacturing method of the invention is not limited to the case where a functional film such as a gas barrier film is manufactured by RtoR on the support B in strip form. For example, the manufacturing method of the invention may be of the type in which a so-called sheet-feed (batch) type film forming method is used on the support B in cut sheet form to manufacture a functional film.

Also in the case of using the support B in cut sheet form, the organic layer 12 and the inorganic layer 14 as well as the protective organic layer 16 which is the uppermost organic layer are formed by the same method as RtoR manufacturing method to be described below.

In cases where more than one organic layer 12 and/or more than one inorganic layer 14 is formed in the manufacturing method of the invention, the formation methods (film forming methods) applied to the respective layers may be the same or different.

The manufacturing apparatus shown in FIGS. 2A and 2B is used to manufacture a functional film like that shown in FIGS. 1A, 1B, and 1C in which organic layers 12 and inorganic layers 14 are alternately formed on the support B, an organic layer 12 is formed on a surface of the support B, and the uppermost organic layer is the protective organic layer 16.

In the organic film forming device 20 of FIG. 2A for forming the organic layers 12 and the protective organic layer 16, a film forming material Za is constituted of the support B in strip form in itself, or the support B in strip form which has the organic layers 12 and the inorganic layers 14 formed thereon, with an inorganic layer 14 presenting the material surface.

On the other hand, in the inorganic film forming device 24 of FIG. 2B for forming the inorganic layers 14, a film forming material Zb is constituted of the support B in strip form which has one organic layer 12 formed thereon, or the support B in strip form which has two or more organic layers 12 and one or more inorganic layers 16 alternately formed thereon, with an organic layer 12 presenting the material surface.

The organic film forming device 20 shown in FIG. 2A is a device adapted to form the organic layer 12 or the protective organic layer 16 by applying a coating material for forming the organic layer 12 or the protective organic layer 16 onto the film forming material Za, drying the applied coating material, and thereafter cross-linking and curing the organic compound contained in the coating material through light exposure as the film forming material Za is conveyed in its longitudinal direction.

In the illustrated example, the organic film forming device 20 includes, for example, a coating means 26, a drying means 28, a light exposure means 30, a rotary shaft 32, a take-up shaft 34 and conveyor roller pairs 36 and 38.

In addition to the illustrated members, the organic film forming device 20 may include various members provided in known devices which perform film formation through coating as the film forming material in strip form is conveyed, examples thereof including a conveyor roller pair, a guide member for the film forming material Za and various sensors.

In the organic film forming device 20, a material roll 42 into which the film forming material Za is wound is mounted on the rotary shaft 32.

Once the material roll 42 is mounted on the rotary shaft 32, the film forming material Za is let out from the material roll 42 and caused to pass a predetermined conveyance path including the coating means 26, the drying means 28 and the light exposure means 30 to reach the take-up shaft 34 (i.e., fed through the device).

In the organic film forming device 20, the film forming material Za is fed out from the material roll 42 in synchronism with the winding of the film forming material Za on the take-up shaft 34, and the organic layer 12 or the like is continuously formed on the film forming material Za in strip form as the film forming material Za is conveyed in the longitudinal direction along the predetermined conveyance path.

The film forming material Za fed out from the material roll 42 is nipped by the conveyor roller pair 36 and as such conveyed first to the coating means 26.

The coating means 26 is used to apply onto a surface of the film forming material Za the coating material for forming the organic layer 12 or the coating material for forming the protective organic layer 16.

In the manufacturing method of the invention, the organic layer 12 (12a) formed on the surface of the support may be formed using the coating material for use in forming a layer made of a known organic compound. In contrast, the protective organic layer 16 (the organic layers 12b and 12c) formed on the inorganic layer 14 is formed with a coating material which contains an organic solvent, an organic compound for forming the protective organic layer 16, and a silane coupling agent in an amount of 0.1 to 25 wt % in terms of the concentration in the coating material exclusive of the organic solvent (concentration with respect to the total amount of the ingredients excluding the organic solvent that is taken as 100 wt %) but contains no pH adjuster, according to the manufacturing method of the invention.

This point will be described later in further detail.

There is no particular limitation on the method of applying the coating material onto the film forming material Za in the coating means 26.

Therefore, in the application of the coating material, known methods of applying the coating material are all available, as exemplified by die coating, dip coating, air knife coating, curtain coating, roller coating, wire bar coating, gravure coating and slide coating.

The coating means 26 needs to apply the coating material onto the inorganic layer 14 and hence the coating material is preferably applied by die coating (with a die coater). As described above, the inorganic layer 14 is brittle and is prone to cracking or other defects. According to the die coating, it is only the coating material that comes into contact with the inorganic layer 14 and hence damage to the inorganic layer 14 can be advantageously prevented.

The film forming material Za is then conveyed to the drying means 28. The drying means 28 serves to dry the coating material (coating film) applied by the coating means 26.

Upon formation of the protective organic layer 16 (i.e., an organic layer on an inorganic layer), the drying means 28 serves not only as the means for drying the coating material but also as the heating treatment means which performs heating treatment in the manufacturing method of the invention. In other words, in the organic film forming device 20, upon formation of the protective organic layer 16, heating treatment of the coating material to be described later is performed simultaneously with drying of the coating material (heating treatment also serves to dry the coating material).

In the illustrated organic film forming device 20, according to a preferred embodiment, the drying means 28 has a drying means 28a for drying through heating from the front surface side (coating material side) and a drying means 28b for drying through heating from the rear surface side (support B side). In other words, the drying means 28 dries the coating material from both the front and rear surface sides of the film forming material Za. For example, the drying means 28a on the front surface side is a hot air drying means and the drying means 28b on the rear surface side is a heating roller (a pass roller having a heating mechanism).

That is, the drying means 28 dries the coating material by heating the coating material together with the support B. Therefore, upon formation of the protective organic layer 16, the coating material is also sufficiently heated from the side on which the inorganic layer 14 is disposed, thereby being dried and heat-treated.

The organic film forming device 20 having such a configuration is preferable because the organic film forming device 20 makes it possible to exhibit more advantageously the effects of the invention that the coating material for forming the protective organic layer 16 does not need to contain a pH adjuster in spite of its containing a silane coupling agent, and that high adhesion is obtained.

The drying means 28 (heating treatment means) is not particularly limited and known heating means can be all used as long as heating treatment of the coating material to be described later is possible and the coating material can be dried (the organic solvent can be removed) in accordance with, for example, the conveying speed of the support B before the film forming material Za reaches the light exposure means 30, thereby making the organic compound ready to polymerize.

Preferred examples include a heating means using a heating roller, a hot air heating means and a heating means using a heat exchanger plate. These may be used alone or in combination for the drying means 28.

The means for drying the coating material (and the heating means) in the organic film forming device for implementing the manufacturing method of the invention is not limited to the example shown in FIGS. 2A and 2B. In other words, a variety of configurations can be used as above as long as heating treatment of the coating material to be described later is possible and the coating material can be appropriately dried to make the organic compound ready to polymerize.

For instance, the drying means 28a for drying from the front surface side may only be used without using the drying means 28b for drying from the rear surface side.

The film forming material Za is then conveyed to the light exposure means 30. The light exposure means 30 exposes the coating material dried by the drying means 28 after being applied by the coating means 26 to light such as ultraviolet light (UV light) or visible light to cross-link (polymerize) and cure the organic compound (the monomer or oligomer of the organic compound) contained in the coating material, thereby forming the organic layer 12 or the protective organic layer 16.

According to the invention, photopolymerization is not the sole method for cross-linking the organic compound, and various methods such as thermal polymerization, electron beam polymerization and plasma polymerization can be used in accordance with the organic compounds for forming the organic layer 12 and the protective organic layer 16. In the manufacturing method of the invention, acryl type resins such as acrylic resins and methacrylic resins are advantageously used as described above for the organic layer 12 and the protective organic layer 16 and therefore photopolymerization and electron beam polymerization are used with advantage.

The film forming material Za on which the organic layer 12 or the protective organic layer 16 was formed in this manner is nipped and conveyed by the conveyor roller pair 38 to the take-up shaft 34, and rewound on the take-up shaft 34 into a roll.

The film forming material Za having the organic layer 12 formed thereon (i.e., the film forming material Zb) is fed to the inorganic film forming device 24 (more specifically a feed chamber 50 thereof) shown in FIG. 2B as a material roll 46 to be subjected to film formation in the inorganic film forming device 24 for forming the inorganic layer 14.

On the other hand, the film forming material Za having the protective organic layer 16 formed thereon is fed to a next step as a product roll 48 into which the gas barrier film 10a (10b or 10c; functional film) is wound.

The inorganic film forming device 24 is provided to form (deposit) the inorganic film 14 on the surface of the film forming material Zb, that is, on the surface of the organic layer 12 by vapor-phase deposition (vacuum deposition), and it includes the feed chamber 50, a film forming chamber 52 and a take-up chamber 54.

In addition to the illustrated members, the inorganic film forming device 24 may include various members provided in known devices which perform film formation through vapor-phase deposition as the film forming material in strip form is conveyed, examples thereof including a conveyor roller pair, a guide member for regulating the position in the width direction of the film forming material Zb and various sensors.

The feed chamber 50 includes a rotary shaft 56, a guide roller 60 and a vacuum evacuation means 61.

In the inorganic film forming device 24, the material roll 46 into which the film forming material Zb is wound is mounted on the rotary shaft 56 of the feed chamber 50.

Upon mounting of the material roll 46 on the rotary shaft 56, the film forming material Zb is conveyed along a predetermined conveyance path starting from the feed chamber 50 and passing through the film forming chamber 52 to reach a take-up shaft 58 of the take-up chamber 54. Also in the inorganic film forming device 24, the film forming material Zb is fed out from the material roll 46 in synchronism with the winding of the film forming material Zb after film formation on the take-up shaft 58, and the inorganic layer 14 is continuously formed on the film forming material Zb in the film forming chamber 52 as the film forming material Zb is conveyed in the longitudinal direction.

In the feed chamber 50, the rotary shaft 56 is rotated by a drive source (not shown) in a clockwise direction in the drawing so that the film forming material Zb is fed out from the material roll 46. In addition, the feed chamber 50 uses the guide roller 60 to guide the film forming material Zb fed out from the material roll 46 along the predetermined path to convey the film forming material Zb to the film forming chamber 52 through a slit 76a formed in a partition wall 76.

In a preferred embodiment of the illustrated inorganic film forming device 24, the feed chamber 50 and the take-up chamber 54 are provided with vacuum evacuation means 61 and 82, respectively. In the inorganic film forming device 24, during the film formation, the vacuum evacuation means are used to maintain the feed chamber 50 and the take-up chamber 54, respectively, at given pressures as determined by the pressure (pressure for film formation) in the film forming chamber 52 to be described later. In this manner, the pressures in the adjoining chambers are prevented from adversely affecting the pressure in the film forming chamber 52 (film formation in the film forming chamber 52).

The vacuum evacuation means 61 is not particularly limited, and use may be made of various known (vacuum) evacuation means employed in vacuum deposition devices including vacuum pumps such as a turbo pump, a mechanical booster pump, a dry pump, and a rotary pump. In this regard, the same applies to the other vacuum evacuation means 74 and 82 described later.

The film forming chamber 52 is provided to form the inorganic layer 14 by vacuum deposition on the surface of the film forming material Zb, that is, the organic layer 12. In the illustrated example, the film forming chamber 52 includes a drum 62, a film forming means 64, a guide roller 68, a guide roller 72 and the vacuum evacuation means 74.

The film forming material Zb conveyed to the film forming chamber 52 is guided by the guide roller 68 along the predetermined path to a predetermined position of the drum 62. The film forming material Zb is conveyed in the longitudinal direction as it is positioned at the predetermined position by the drum 62 and the inorganic layer 14 is formed by the film forming means 64 through vapor-phase deposition.

The vacuum evacuation means 74 is provided to evacuate the film forming chamber 52 to a degree adequate for the formation of the inorganic film 14 through vapor-phase deposition.

The drum 62 is a cylindrical member which rotates about the central axis counterclockwise in the drawing.

The film forming material Zb fed from the feed chamber 50 and guided by the guide roller 68 along the predetermined path to the predetermined position on the drum 62 is wrapped around the drum 62 in a predetermined region of its peripheral surface and conveyed along the predetermined conveyance path as it is supported and guided by the drum 62, and the inorganic layer 14 is formed on the surface by the film forming means 64.

The film forming means 64 is provided to form the inorganic layer 14 by vacuum deposition on the surface of the film forming material Zb (organic layer 12).

In the manufacturing method of the invention, the inorganic layer 14 may be formed by any known vapor-phase deposition process (vacuum deposition process) including a formation process described in JP 2001-125079 A. Therefore, the film forming process used in the film forming means 64 is not particularly limited and known film forming processes including CVD, plasma CVD, sputtering, vacuum deposition and ion plating can be all used.

Accordingly, the film forming means 64 is made up of various members adequately selected depending on the vacuum deposition process to be implemented.

For instance, when the film forming chamber 52 is of a type in which the inorganic film 14 is formed by ICP-CVD (inductively coupled plasma CVD), the film forming means 64 includes an induction coil for forming an induced magnetic field, and a gas supply means for supplying a reactive gas on the region where the film is formed.

When the film forming chamber 52 is of a type in which the inorganic film 14 is formed by CCP-CVD (capacitively coupled plasma CVD), the film forming means 64 includes a shower head electrode which is hollow and has a large number of small holes at the surface facing the drum 62, which is connected to a reactive gas supply source, and which functions as an RF electrode and a means for supplying a reactive gas.

When the film forming chamber 52 is of a type in which the inorganic film 14 is formed by vacuum deposition, the film forming means 64 includes a crucible (evaporation source) to be filled with a film material, a shutter for covering the crucible and a heating means for heating the film material in the crucible.

In addition, when the film forming chamber 52 is of a type in which the inorganic film 14 is formed by sputtering, the film forming means 64 includes a means for supporting a target, an RF electrode, and a gas supply means.

The film forming material Zb having the inorganic layer 14 formed by the film forming means 64 as it is supported and conveyed by the drum 62 is guided by the guide roller 72 along the predetermined path and conveyed into the take-up chamber 54 through a slit 78a formed in a partition wall 78.

In the illustrated example, the take-up chamber 54 includes a guide roller 80, the take-up shaft 58, and the vacuum evacuation means 82.

The film forming material Zb having the film formed thereon and conveyed into the take-up chamber 54 is wound on the take-up shaft 58 into a roll to form a material roll 42. The film forming material Zb having the inorganic layer 14 formed thereon is fed to the organic film forming device 20

(and mounted on the rotary shaft 32) as the material roll 42 into which the film forming material Zb is wound.

The manufacturing method of the invention is described below in further detail by referring to the operations in manufacturing the gas barrier film 10*a* having three layers, namely, the organic layer 12, the inorganic layer 14 and the protective organic layer 16 as shown in FIG. 1A with the use of the manufacturing apparatus shown in FIGS. 2A and 2B.

Upon manufacture of the gas barrier film 10*a*, the support roll into which the support B in strip form serving as the film forming material Za is wound is first mounted on the rotary shaft 32 as the material roll 42 and the organic layer 12 is formed on a surface of the support B.

Once the material roll 42 is mounted on the rotary shaft 32, the support B is let out from the material roll 42 and caused to pass along the predetermined conveyance path which starts from the conveyor roller pair 36 and passes through the coating means 26, the drying means 28, the light exposure means 30 and the conveyor roller pair 38 to reach the take-up shaft 34.

As described above, the organic film forming device 20 is a device making use of RtoR. To be more specific, in the organic film forming device 20, the film forming material Za is fed out from the material roll 42 in synchronism with the winding of the film forming material Za on the take-up shaft 34, and the organic layer 12 or the like is continuously formed as the film forming material Za is conveyed in its longitudinal direction.

The support B (film forming material Za) let out from the material roll 42 is conveyed by the conveyor roller pair 36 to the coating means 26, where the coating material for forming the organic layer 12 is applied onto the surface of the support (where the layer is to be formed). As described above, the organic layer 12 is a layer made of a known organic compound and may be formed by any known coating process.

Therefore, as the coating material for forming the organic layer 12, use may be made of a known coating material for forming a film made of an organic compound, the known coating material being obtained by dissolving an organic compound (a monomer or oligomer) for forming the organic layer 12 in an organic solvent and optionally adding various additives such as a silane coupling agent, a pH adjuster and a photopolymerization initiator.

The support B to which the coating material for forming the organic layer 12 was applied is then heated by the drying means 28 to remove the organic solvent and dry the coating material.

The support B after the drying of the coating material is then exposed to UV light or the like by the light exposure means 30 to polymerize (cross-link) and cure the organic compound, thereby forming the organic layer 12. The organic compounds used to form the organic layer 12 and the protective organic layer 16 may be optionally polymerized in an inert atmosphere such as a nitrogen atmosphere.

The support B having the organic layer 12 formed thereon is conveyed by the conveyor roller pair 38 and wound on the take-up shaft 34 into a roll.

Upon completion of the formation of the organic layer 12 having a predetermined length, the support B is cut as necessary, fed to the inorganic film forming device 24 shown in FIG. 2B in the form of the material roll 46 into which the support B having the organic layer 12 formed thereon (the film forming material Za having the organic layer 12 formed thereon) is wound, and used to form the inorganic layer 14.

In the inorganic film forming device 24, the material roll 46 is mounted on the rotary shaft 56 of the feed chamber 50.

Upon mounting of the material roll 46 on the rotary shaft 56, the support B having the organic layer 12 formed thereon (film forming material Zb) is let out and caused to pass along the predetermined path which starts from the feed chamber 50 and passes through the film forming chamber 52 to reach the take-up shaft 58 of the take-up chamber 54.

The inorganic film forming device 24 is also a device making use of RtoR. Therefore, in the inorganic film forming device 24 as well, the film forming material Zb is fed out from the material roll 46 in synchronism with the winding of the film forming material Zb on the take-up shaft 58, and the inorganic layer 14 is continuously formed by vapor-phase deposition as the film forming material Zb is conveyed in the longitudinal direction.

The support B having the organic layer 12 formed thereon is fed out from the material roll 46 and guided by the guide roller 60 into the film forming chamber 52.

The support B having the organic layer 12 formed thereon and conveyed into the film forming chamber 52 is guided by the guide roller 68 and wrapped around the drum 62, and the inorganic layer 14 is formed by the film forming means 64 as the support B is supported by the drum 62 and conveyed along the predetermined path. The inorganic layer 14 is formed by, for example, plasma CVD (CCP-CVD).

The inorganic layer 14 may be formed by a silicon compound layer forming method using a known vapor-phase deposition process. Therefore, the process gas to be used and the film forming conditions may be appropriately set and/or select according to the inorganic layer 14 to be formed, the thickness of the inorganic layer 14 and the like.

The support B having the inorganic layer 14 formed thereon (film forming material Zb having the inorganic layer formed thereon) is guided by the guide roller 72 into the take-up chamber 54.

The support B having been conveyed into the take-up chamber 54 is guided by the guide roller 58 to the take-up shaft 58, where the support B is wound on the take-up shaft 58 into a roll.

After completion of the formation of the inorganic layer 14, cleaned dry air is introduced into all the chambers of the inorganic film forming device 24 so that the chambers are open to the atmosphere.

Thereafter, the support B having the organic layer 12 and the inorganic layer 14 formed thereon is cut as necessary and is taken out from the take-up chamber 54 of the inorganic film forming device 20 in the form of the material roll 42 into which the support B having the organic layer 12 and the inorganic layer 14 formed thereon is wound.

The material roll 42 into which the support B having the organic layer 12 and the inorganic layer 14 formed thereon (the film forming material Za having the inorganic layer formed thereon) is wound is fed to the organic film forming device 20 again in order to form the protective organic layer 16 as the uppermost layer.

As described above, the organic layer 12*b* of the gas barrier film 10*b* shown in FIG. 1B and the organic layers 12*b* and 12*c* of the gas barrier film 10*c* shown in FIG. 1C according to the invention are basically the same as the protective organic layer 16. Accordingly, these organic layers (the organic layers overlying the inorganic layers) can be formed in the same manner as the protective organic layer 16 to be described later.

As in the previous formation of the organic layer 12, the material roll 42 into which the support B having the organic layer 12 and the inorganic layer 14 formed thereon is wound is mounted on the rotary shaft 32 and caused to pass along the predetermined conveyance path terminated by the take-up shaft 34.

In the formation of the protective organic layer 16, the organic film forming device 20 forms the protective organic layer 16 in the same manner as in the previous formation of the organic layer 12, to be more specific, by applying the coating material for forming the protective organic layer 16 using the coating means 26 as the support B having the organic layer 12 and the inorganic layer 14 formed thereon (film forming material Za) is conveyed in its longitudinal direction, drying the applied coating material with the drying means 28 and curing the dried coating material with the light exposure means 30.

The organic film forming device 20 is basically a device for forming the organic layer 12 in the atmosphere.

Therefore, the period from the point in time when the take-up chamber 54 of the inorganic film forming device 24 is opened to the atmosphere to the point in time when the coating material for forming the protective organic layer 16 is applied onto the inorganic layer 14 by the coating means 26 is given to the step of exposing the surface of the inorganic layer 14 to air in the manufacturing method of the invention.

—O and —OH groups are introduced to the surface of the inorganic layer 14 by the step of exposing the surface to air.

As described above, according to the invention, the inorganic layer 14 is a silicon compound layer. In addition, according to the invention, the inorganic layer 14 is formed by vapor-phase deposition.

In the silicon compound layer formed by vapor-phase deposition, all the silicon is not present in the form of a desired compound, such as silicon nitride. In other words, silicon having dangling bonds is also present in the silicon compound layer formed by vapor-phase deposition. In particular, silicon having dangling bonds is present in a large quantity at the surface of the inorganic layer 14.

Therefore, —O and —OH groups can be bonded to the dangling bonds by exposing the surface of the inorganic layer 14 to air (atmosphere) after the formation of the inorganic layer 14. —O and —OH groups, particularly —OH group can be thus introduced to the surface of the inorganic layer 14.

The reaction of the silane coupling agent can be allowed to proceed appropriately in the invention by introducing groups such as —OH group to the surface of the inorganic layer 14 even if the coating material for forming the protective organic layer 16 contains no pH adjuster. This point will be described later in further detail.

The timing at which the surface of the inorganic layer 14 is exposed to air in the invention is not limited to the above-described example. That is, any timing or method may be applied if the step of exposing to air the surface of the inorganic layer 14 on which the organic layer is to be formed as the overlying layer is performed in the period from the formation of the inorganic layer 14 to the formation of the overlying organic layer.

For example, in cases where the inorganic film forming device 24 is opened to the atmosphere with an inert gas such as nitrogen after the formation of the inorganic layer 14, the period from the taking out of the material roll 42 from the take-up chamber 54 to the application of the coating material for forming the protective organic layer 16 is given to the step of exposing the surface of the inorganic layer 14 to air.

As described above, in the organic film forming device 20, the coating material for forming the protective organic layer 16 is applied onto the inorganic layer 14 by the coating means 26 as the support B having the organic layer 12 and the inorganic layer 14 formed thereon is conveyed in its longitudinal direction. As described above, the method of applying the coating material using the coating means 26 is not particularly limited and die coating is suitable.

In the manufacturing method of the invention, the coating material for forming the protective organic layer 16 contains an organic solvent, an organic compound for forming the protective organic layer 16, and a silane coupling agent in an amount of 0.1 to 25 wt % in terms of the concentration in the coating material exclusive of the organic solvent (concentration with respect to the total amount of the ingredients excluding the organic solvent that is taken as 100 wt %). In addition, according to the invention, the coating material for forming the protective organic layer 16 contains no pH adjuster which is usually added as an essential ingredient when a silane coupling agent is used. This point will be described later in further detail.

When the content of the silane coupling agent in the coating material for forming the protective organic layer 16 is less than 0.1 wt % in the manufacturing method of the invention, the effect of addition of the silane coupling agent is not sufficiently obtained, thus causing defects such as low adhesion between the inorganic layer 14 and the protective organic layer 16.

Contrarily, when the content of the silane coupling agent in the coating material for forming the protective organic layer 16 exceeds 15 wt %, the amount of the silane coupling agent is too large to properly form the protective organic layer 16, thus causing defects such as deterioration of the gas barrier properties (desired function).

In view of these points, the content of the silane coupling agent in the coating material for forming the protective organic layer 16 is preferably from 1 to 20 wt %, especially from 3 to 15 wt %.

The organic solvent for use in preparation of the coating material for forming the protective organic layer 16 is not particularly limited and various organic solvents including methyl ethyl ketone (MEK), which are used to form organic layers in organic/inorganic laminate type functional films can be used.

In the present invention, various additives for use in formation of an organic compound film, such as a photopolymerization initiator, may be added, as required, to the coating material for forming the protective organic layer 16 as long as the coating material contains the above-described essential ingredients but no pH adjuster.

The organic compound for forming the protective organic layer 16 is not particularly limited either and various organic compounds (monomers/oligomers) capable of forming the protective organic layer 16 through polymerization can be used.

In particular, the radical polymerizable compounds and/or the cationic polymerizable compounds each having ether group as a functional group, which are illustrated in the description of the protective organic layer 16, are preferable in terms of heat resistance in heating treatment to be described later. Of these, acrylate and/or methacrylate monomers and oligomers are more preferable. Trifunctional or higher acrylate and/or methacrylate monomers and oligomers are particularly preferable.

The coating material for forming the protective organic layer 16 preferably contains a trifunctional or higher acrylate monomer or oligomer in an amount of 50 wt % or more, most preferably 70 wt % or more, based on the concentration in the coating material exclusive of the organic solvent, also in terms of heat resistance in heating treatment.

A compound having a higher glass transition temperature Tg than the azeotropic point of a by-product due to the silane coupling agent contained in the coating material (a by-product mainly produced by hydrolysis (usually an alcohol)) and an organic solvent used in the coating material is preferably used as the organic compound for forming the protective organic layer 16. In the following description, the azeotropic point of the by-product and the organic solvent is simply referred to as "by-product azeotropic point" for descriptive purposes.

Alternatively, in cases where the by-product due to the silane coupling agent is not azeotropic with the organic solvent used, a compound having a higher Tg than the higher of the boiling points of the by-product and the organic solvent is preferably used as the organic compound for forming the protective organic layer 16. In the following description, the higher of the boiling points of the by-product and the organic solvent is referred to as "coating material boiling point" for descriptive purposes.

In the manufacturing method of the invention, in cases where the by-product is azeotropic with the organic solvent, the coating material for forming the protective organic layer 16 is subjected to heating treatment at a higher temperature than the by-product azeotropic point after the coating material is applied but before the coating material is dried. Alternatively, in cases where the by-product is not azeotropic with the organic solvent, the coating material for forming the protective organic layer 16 is subjected to heating treatment at a higher temperature than the coating material boiling point after the coating material is applied but before the coating material is dried.

In the illustrated organic film forming device 20, the drying means 28 performs heating treatment and drying of the coating material simultaneously upon formation of the protective organic layer 16.

When the heat resistance of the organic compound for forming the protective organic layer 16 is too low, the organic compound is softened by heat during the heating treatment and drying, which may cause defects such as improper drying and change in quality of the organic compound.

Therefore, the organic compound having a higher Tg than the by-product azeotropic point or the coating material boiling point is preferably used in the invention as the organic compound for forming the protective organic layer 16. The softening of the organic compound or other damage thereto is thus prevented upon heating treatment and drying of the coating material to be described later, whereupon the proper protective organic layer 16 can be consistently formed from the properly dried coating material.

The coating material applied by the coating means 26 is dried by the drying means 28.

In the illustrated organic film forming device 20, upon formation of the protective organic layer 16, the drying means 28 simultaneously performs drying of the coating material for forming the protective organic layer 16 and heating treatment for heating the coating material (for elevating the temperature of the film surface of the coating material in contact with the inorganic layer 14) to a higher temperature than the by-product azeotropic point. Alternatively, in cases where the by-product derived from the silane coupling agent is not azeotropic with the organic solvent, the drying means 28 simultaneously performs drying of the coating material for forming the protective organic layer 16 and heating treatment for heating the coating material (for elevating the temperature of the film surface of the coating material in contact with the inorganic layer 14) to a higher temperature than the coating material boiling point.

The present invention exposes the surface of the inorganic layer 14 to air, uses the coating material containing the silane coupling agent in a predetermined amount but containing no pH adjuster, and performs heating treatment for heating the coating material to a higher temperature than the by-product azeotropic point or the coating material boiling point to form the protective organic layer 16 (organic layer on the inorganic layer), whereby a gas barrier film having excellent adhesion between the underlying inorganic layer 14 and the protective organic layer 16 and high gas barrier performance (high-performance functional film) can be manufactured.

In the manufacture of an organic/inorganic laminate type gas barrier film or the like, a silane coupling agent is added to the coating material for forming an organic layer upon formation of the organic layer overlying an inorganic layer in order to ensure the adhesion between the two layers.

As is well known, the silane coupling agent is a compound in which a hydrolyzable group such as an alkoxy group and an organic functional group such as an amino group that can be expected to have a reaction or interaction with an organic substance are bonded to silicon.

In the silane coupling agent, the hydrolyzable group is hydrolyzed to obtain —OH group and dehydration condensation takes place between the —OH group and —OH group at the surface of the inorganic compound to cause strong covalent bonding between the silane coupling agent and the surface of the inorganic compound. The silane coupling agent is also strongly bonded to the organic compound by copolymerization between the organic functional group and the organic compound or the like.

The silane coupling agent thus improves the adhesion between the organic layer and the inorganic layer.

The pH greatly affects the hydrolysis of the hydrolyzable group of the silane coupling agent. Therefore, it is considered to be essential to adjust the pH by addition of a pH adjuster (by dropwise addition of an acid or an alkali) to the coating material using the silane coupling agent in order to cause hydrolysis of the hydrolyzable group.

However, as described above, the addition of the pH adjuster causes hydrolysis to proceed to encounter problems such as an increase in the viscosity of the coating material with time.

However, according to the study made by the inventors of the invention, in the case of a laminated structure containing an organic layer and an inorganic layer in which the inorganic layer is made of a silicon compound, a hydrolysis reaction and dehydration condensation of the silane coupling agent take place without pH adjustment by introducing —O group, preferably —OH group to the surface of the inorganic layer so that silicon is present in the form of "SiOH" or the like, applying the coating material containing the silane coupling agent in an appropriate amount to the surface, and subjecting the coating material to heating treatment at a higher temperature than the by-product azeotropic point or the coating material boiling point before the end of drying.

In other words, by heating the coating material to a higher temperature than the by-product azeotropic point with a group such as —OH group being introduced to the surface of the inorganic layer, the —OH group or the like is released from the surface of the inorganic layer and a hydrolysis reaction of the silane coupling agent takes place, whereby the surface of the inorganic layer is bonded to the silane coupling agent by covalent bonding through dehydration condensation.

In addition, the by-product and the like are also evaporated and removed together with the organic solvent of the coating material by heating the coating material to a temperature equal to or higher than the by-product azeotropic point or the coating material boiling point. As a result, the reaction cycle is accelerated to further promote the bonding between the surface of the inorganic layer and the silane coupling agent.

In other words, according to the invention, the adhesion between the inorganic layer 14 and the protective organic layer 16 can be ensured by the silane coupling agent without using a pH adjuster which was essential when the silane coupling agent was used.

The coating material for forming the protective organic layer 16 can be applied by a common method performed in the atmosphere, so that the productivity can be also improved.

In addition, heating is performed at a temperature equal to or higher than the temperature at which a by-product derived from the silane coupling agent evaporates. As a result, the by-product such as an alcohol produced by hydrolysis of the silane coupling agent during heating can be removed to considerably reduce the amount of the by-product remaining in the organic layer.

Accordingly, the protective organic layer 16 which does not have impurities, i.e., by-products derived from the silane coupling agent, which is of high quality, and which advantageously exhibits its performance can be formed. When the inorganic layer 14b is further formed on the organic layer 12b formed on the inorganic layer 14a as in the gas barrier film 10b shown in FIG. 1B, the evaporation of the by-products and the like eliminates the adverse effects on the formation of the inorganic layer 14b, so that the inorganic layer 14b formed is compact to enable manufacture of a gas barrier film having high gas barrier performance.

In addition, the coating material containing no pH adjuster can avoid increase in viscosity with time due to addition of a pH adjuster.

Furthermore, the pH adjuster is an impurity for the coating material for forming the protective organic layer 16, that is to say, for the formation material of an organic layer. Therefore, addition of a pH adjuster to the coating material may change the viscosity or reduce the temperature Tg of the organic compound or the protective organic layer 16 formed. According to the invention, however, these defects can also be prevented (suppressed).

As is well known, heating of the coating material causes convection of the coating material which is directed upward from the bottom in the film. This convection makes it possible to promote not only the drying of the coating material but the reaction between the silane coupling agent and the inorganic layer 14 at and near the surface of the inorganic layer 14.

As a result, the silane coupling agent is oriented in the vicinity of the surface of the inorganic layer 14 and the protective organic layer 16 is composed on its surface side of a high-purity organic compound with less silane coupling agent associated. In this way, the surface of the protective organic layer 16 has suitable characteristics such as Tg according to, for example, the formation material and the protective organic layer 16 can appropriately exhibit desired functions. In addition, since the silane coupling agent can be oriented in the vicinity of the surface of the inorganic layer 14, a sufficient effect of the addition can be obtained even if the amount of the silane coupling agent added is small.

The illustrated case where the drying means 28 heat-treats (and dries) the coating material from both of the front surface side (coating material side) and the rear surface side (support B side, i.e., inorganic layer 14 side) is more preferable because this effect can be more advantageously obtained.

In the manufacturing method of the invention, heating treatment of the coating material for forming the protective organic layer 16 is to be performed before the end of drying of the coating material. Therefore, for instance, a heating means for heating treatment of the coating material may be separately provided upstream of the drying means of the coating material so that the coating material is dried after the heating treatment of the coating material.

However, it is preferable to perform heating treatment and drying of the coating material simultaneously as in the illustrated case in view of productivity and simplification of the device configuration.

In the manufacturing method of the invention, heating treatment of the coating material for forming the protective organic layer 16 is to be performed at a higher temperature than the by-product azeotropic point. Alternatively, in cases where a by-product derived from the silane coupling agent is not azeotropic with the organic solvent as described above, the temperature of the heating treatment is to be higher than the coating material boiling point.

When the temperature of the heating treatment of the coating material is lower than the by-product azeotropic point or the coating material boiling point, the above-described hydrolysis and dehydration condensation reaction of the silane coupling agent do not proceed sufficiently.

There is no particular limitation on the upper limit of the temperature of the heating treatment of the coating material. According to the study made by the inventors of the invention, the higher the heating treatment temperature is, the better the adhesion obtained between the organic layer and the inorganic layer is. On the other hand, in the heating treatment at a temperature exceeding the softening point of the support B, heat causes damage to the support B to hinder the manufacture of a proper product. Therefore, the temperature of the heating treatment of the coating material is preferably equal to or lower than the softening point of the support B used.

Furthermore, the heating treatment time is also not particularly limited and may be appropriately set according to the heating treatment temperature and the like.

According to the study made by the inventors of the invention, the above-described hydrolysis and dehydration condensation reaction of the silane coupling agent proceed sufficiently in many cases by performing heating treatment for 1 minute or more at a temperature exceeding the by-product azeotropic point or the coating material boiling point, and therefore the various effects as described above can be advantageously obtained.

The support B having the organic layer 12 and the inorganic layer 14 formed thereon (film formation material Za) as subjected to the heating treatment and drying of the coating material using the drying means 28 is then conveyed to the light exposure means 30, where the support is exposed to UV light, visible light or the like.

As a result of this light exposure, the organic compound of the coating material is polymerized (cross-linked) to cure the coating material, whereby the protective organic layer 16 is formed on the inorganic layer 14.

The support B having the organic layer 12, the inorganic layer 14 and the protective organic layer 16 formed thereon (film forming material Za having the protective organic layer 16 formed thereon), in short, the gas barrier film 10a is wound on the take-up shaft 34 into a roll.

After the end of the formation of the protective organic layer 16, the gas barrier film 10a is cut as necessary and fed to the next step as the product roll 48 into which the gas barrier film 10a is wound.

The manufacturing apparatus shown in FIGS. 2A and 2B is advantageously used to manufacture not only the three-layer type gas barrier film 10a as described above but also an organic/inorganic laminate type gas barrier film (functional film) in which organic layers and inorganic layers are alternately formed.

For instance, in the manufacture of the gas barrier film 10b of an organic/inorganic five-layer type as shown in FIG. 1B, the organic layer 12a is first formed on a surface of the support B by the organic film forming device 20; the inorganic layer 14a is then formed on a surface of the organic layer 12a by the inorganic film forming device 24; the organic layer 12b is then formed on a surface of the inorganic layer 14a by using the organic film forming device 20 again; the inorganic layer 14b is then formed on a surface of the organic layer 12b by using the inorganic film forming device 24 again; and lastly the protective organic layer 16 is formed on a surface of the inorganic layer 14b by the organic film forming device 20.

In the manufacture of a functional film having a larger number of organic layers and inorganic layers, such as the gas barrier film 10c of an organic/inorganic seven-layer type as shown in FIG. 1C, formation of the organic layer 12 and the inorganic layer 14 is repeated in the same manner to form a predetermined number (number smaller by 1 than the total number of organic and inorganic layers) of organic layers 12 and inorganic layers 14 and lastly the protective organic layer 16 is formed on the inorganic layer 14.

As described above, the organic layers respectively formed on the inorganic layers are formed in the same manner as the protective organic layer 16 of the above-described gas barrier film 10a.

While the functional film manufacturing method and the functional film according to the present invention have been described above in detail, the present invention is by no means limited to the foregoing embodiments and it should be understood that various improvements and modifications may of course be made without departing from the scope and spirit of the invention.

EXAMPLES

Next, the present invention is described in further detail by referring to the specific examples of the invention.

Example 1

The manufacturing apparatus shown in FIGS. 2A and 2B was used to prepare the three-layer gas barrier film 10a as shown in FIG. 1A including the organic layer 12, the inorganic layer 14 and the protective organic layer.

A strip of PET film (polyethylene terephthalate film) with a width of 1,000 mm and a thickness of 100 μm was used as the support B.

An organic compound and a photopolymerization initiator were dissolved in the organic solvent (MEK) to prepare a coating material for forming the organic layer 12.

TMPTA (Daicel-Cytec Company, Ltd.) was used as the organic compound and Irg 184 (Ciba Specialty Chemicals Corp.) was used as the photopolymerization initiator. The coating material was prepared so that the solid content concentration was 20 wt %, and that the organic compound and the photopolymerization initiator were contained in amounts of 95 wt % and 5 wt %, respectively, in terms of the concentration in the coating material exclusive of the organic solvent.

The material roll 42 into which the support B (film forming material Za) was wound was mounted on the rotary shaft 32 of the organic film forming device 20 shown in FIG. 2A; the prepared coating material was applied onto the surface of the support B and the applied coating material was dried; the dried coating material was cross-linked by exposure to UV light to obtain the material roll 46 into which the film forming material Za having the organic layer 12 formed thereon was wound.

The amount of the coating material applied by the coating means 26 was adjusted so that the organic layer 12 had a thickness of 1 μm. A die coater was used as the coating means 26. The coating material was dried by heating to 80° C. with hot air from the drying means 28. In addition, a UV irradiator was used as the light exposure means 30 and the amount of light was adjusted so that exposure to UV light was carried out to an accumulated exposure amount of about 500 mJ/cm$^2$.

Then, the material roll 46 was mounted on the inorganic film forming device 24 shown in FIG. 2B to form a silicon nitride film with a thickness of 50 nm as the inorganic layer 14 by CCP-CVD on a surface of the support B having the organic layer 12 formed thereon (film forming material Zb).

The film forming means 64 included a shower head electrode disposed so as to face the drum 62, an RF power source for supplying plasma excitation power to the shower head electrode, a bias power source for supplying bias power to the drum 62, and a supply means for supplying a gas material to the shower head electrode. In addition, the drum 62 was made of a stainless steel and served as the counter electrode of the shower head electrode.

The gases used for film formation were silane gas ($SiH_4$), ammonia gas ($NH_3$), nitrogen gas ($N_2$) and hydrogen gas ($H_2$). The amounts of supplied silane gas, ammonia gas, nitrogen gas and hydrogen gas were 100 sccm, 200 sccm, 500 sccm and 500 sccm, respectively. The pressure for film formation was set to 50 Pa.

The shower head electrode for film formation was supplied with plasma excitation power of 3,000 W at a frequency of 13.5 MHz from the RF power source. Furthermore, the drum 62 was supplied with bias power of 500 W from the bias power source. The temperature of the drum 62 was adjusted to −20° C. during film formation.

After the end of the formation of the inorganic layer 14, cleaned dry air was introduced into the feed chamber 50, the film forming chamber 52 and the take-up chamber 54 so that the chambers were opened to the atmosphere.

Then, the material roll 42 into which the support B having the organic layer 12 and the inorganic layer 14 formed thereon was wound was taken out from the take-up chamber 54.

On the other hand, an organic compound, a silane coupling agent and a photopolymerization initiator were dissolved in the organic solvent (MEK) to prepare a coating material for forming the protective organic layer 16.

The organic compound and the photopolymerization initiator were the same as those used in the organic layer 12. The silane coupling agent used was KBM5103 (Shin-Etsu Chemical Co., Ltd.).

The coating material was prepared so that the solid content concentration was 20 wt %, and that the organic compound, the silane coupling agent and the photopolymerization initiator were contained in amounts of 94.7 wt %, 0.3 wt % and 5 wt %, respectively, in terms of the concentration in the coating material exclusive of the organic solvent (Inventive Example 1-1).

The azeotropic point of the by-product (methanol) derived from the silane coupling agent and MEK as the organic solvent is generally about 65° C. although it varies with the amount of remaining MEK and the amount of produced methanol.

The material roll 42 into which the support B having the organic layer 12 and the inorganic layer 14 formed thereon was wound was mounted on the rotary shaft 32 of the organic film forming device 20; the prepared coating material was applied onto the surface of the support B and the applied coating material was dried; the dried coating material was cross-linked by exposure to UV light to obtain the product roll 48 into which the support B having the organic layer 12, the inorganic layer 14 and the protective organic layer 16 formed thereon, in short, the gas barrier film 10a was wound.

The amount of the coating material applied by the coating means 26 was adjusted so that the organic layer 12 had a thickness of 1 μm. The coating material was dried by heating to 80° C. with hot air from the drying means 28. That is, the heating temperature of the coating material for forming the protective organic layer 16 is 80° C. In addition, the amount of light from the light exposure means 30 was adjusted so that exposure to UV light was carried out to an accumulated exposure amount of about 500 mJ/cm$^2$.

Seven coating materials were also prepared by changing the amounts of the organic compound and the silane coupling agent to be added to the coating materials for forming the protective organic layer 16 as follows, with each amount having been specified in terms of the concentration in the coating material exclusive of the organic solvent: The content of the organic compound was 95 wt % and the content of the silane coupling agent was 0 wt % (Comparative Example 1-1); the content of the organic compound was 94 wt % and the content of the silane coupling agent was 1 wt The content of the photopolymerization initiator was 5 wt % in terms of the concentration in the coating material exclusive of the organic solvent and was uniform in all the coating materials.

These seven coating materials were used and treated in quite the same manner as above to prepare gas barrier films each having the organic layer 12, the inorganic layer 14 and the protective organic layer 16 formed on the support B.

In other words, in Example 1, in total eight types of gas barrier films were prepared in Inventive Examples 1-1 to 1-6 and Comparative Examples 1-1 and 1-2.

The adhesion of the protective organic layer 16 of each of the prepared gas barrier films was examined by cross-cut peeling and evaluated by the number of peeled squares. The test applied was a cross-cut peeling test cutting a sample into 100 squares.

A sample in which the number of peeled squares was from 0 to 10 was rated as good;

a sample in which the number of peeled squares was from 11 to 50 was rated as fair; and a sample in which the number of peeled squares was 51 or more was rated as poor.

In addition, the gas barrier properties (moisture vapor transmission rate [g/(m$^2$·day)]) of the prepared gas barrier films were measured by the calcium corrosion method (method described in JP 2005-283561 A).

A sample having a moisture vapor transmission rate of less than $1.0 \times 10^{-4}$ [g/(m$^2$·day)] was rated as excellent;

a sample having a moisture vapor transmission rate of $1.0 \times 10^{-4}$ [g/(m$^2$·day)] or more but less than $2.0 \times 10^{-4}$ [g/(m$^2$·day)] was rated as good;

a sample having a moisture vapor transmission rate of $2.0 \times 10^{-4}$ [g/(m$^2$·day)] or more but less than $1.0 \times 10^{-3}$ [g/(m$^2$·day)] was rated as fair; and a sample having a moisture vapor transmission rate of $1.0 \times 10^{-3}$ [g/(m$^2$·day)] or more was rated as poor.

The results are shown in Table 1 below together with the contents of the organic compound (Main monomer [%]) and the silane coupling agent (Silane [%]) in the coating materials used to form the protective organic layer 16.

TABLE 1

| | Coating material | | Adhesion | | Gas barrier properties | |
|---|---|---|---|---|---|---|
| | Silane [%] | Main monomer [%] | Number of peeled squares | Evaluation | Transmission rate [g/(m2 · day] | Evaluation |
| Comparative Example 1-1 | 0 | 95 | 100 | Poor | 8.1 × 10−5 | Excellent |
| Inventive Example 1-1 | 0.3 | 94.7 | 40 | Fair | 9.2 × 10−5 | Excellent |
| Inventive Example 1-2 | 1 | 94 | 0 | Good | 1.2 × 10−4 | Good |
| Inventive Example 1-3 | 5 | 90 | 0 | Good | 1.3 × 10−4 | Good |
| Inventive Example 1-4 | 10 | 85 | 0 | Good | 1.4 × 10−4 | Good |
| Inventive Example 1-5 | 15 | 80 | 0 | Good | 1.8 × 10−4 | Good |
| Inventive Example 1-6 | 25 | 70 | 0 | Good | 2.4 × 10−4 | Fair |
| Comparative Example 1-2 | 30 | 65 | 0 | Good | 2.1 × 10−3 | Poor |

% (Example 1-2); the content of the organic compound was 90 wt % and the content of the silane coupling agent was 5 wt % (Example 1-3); the content of the organic compound was 85 wt % and the content of the silane coupling agent was 10 wt % (Example 1-4); the content of the organic compound was 80 wt % and the content of the silane coupling agent was 15 wt % (Example 1-5); the content of the organic compound was 70 wt % and the content of the silane coupling agent was 25 wt % (Inventive Example 1-6); and the content of the organic compound was 65 wt % and the content of the silane coupling agent was 30 wt % (Comparative Example 1-2).

As shown in Table 1, in all of Inventive Examples in which the content of the silane coupling agent was 0.1 to 25 wt % and the coating materials were heat-treated and dried at 80° C., the adhesion between the protective organic layer 16 and the inorganic layer 14 and the gas barrier performance are good.

In contrast, in Comparative Example 1-1 in which the coating material for forming the protective organic layer 16 contained no silane coupling agent, 100 squares are all peeled in the cross-cut peeling and the adhesion between the protective organic layer 16 and the inorganic layer 14 is not sufficient. In Comparative Example 1-2 in which the content of the silane coupling agent exceeded 25 wt %, it is considered that the protective organic layer 16 could not exhibit a sufficient protective function for the inorganic layer 14 to cause damage to the inorganic layer 14 upon winding of the gas barrier film into a roll and as a result sufficient gas barrier performance could not be obtained.

Example 2

Example 1 was repeated except that, in the coating materials for forming the protective organic layer 16, the contents of the organic compound, the silane coupling agent and the photopolymerization initiator were fixed to 90 wt %, 5 wt % and 5 wt %, respectively, in terms of the concentration in the coating material exclusive of the organic solvent, and the heating temperature of the coating materials for forming the protective organic layer 16, that is, the drying temperature of the coating materials for forming the protective organic layer 16 was changed to various values, thereby preparing various three-layer type gas barrier films 10a each having the organic layer 12, the inorganic layer 14 and the protective organic layer 16.

The drying temperature of the coating materials for forming the protective organic layer 16 was set to the following six values: Drying temperature 30° C. (Comparative Example 2-1); drying temperature 80° C. (Example 2-1); drying temperature 90° C. (Example 2-2); drying temperature 110° C. (Example 2-3); drying temperature 130° C. (Example 2-4); and drying temperature 150° C. (Example 2-5).

Accordingly, in Example 2, in total six types of gas barrier films were prepared in Examples 2-1 to 2-5 and Comparative Example 2-1.

The adhesion and the gas barrier properties of each of the prepared gas barrier films were measured and evaluated in the same manner as in Example 1.

The results are shown in Table 2 below together with the drying temperature of the coating materials for forming the protective organic layer 16.

TABLE 2

| | Drying temperature [° C.] | Adhesion | | Gas barrier properties | |
|---|---|---|---|---|---|
| | | Number of peeled squares | Evaluation | Transmission rate [g/(m2 · day)] | Evaluation |
| Comparative Example 2-1 | 30 | 95 | Poor | $3.4 \times 10{-4}$ | Fair |
| Inventive Example 2-1 | 80 | 0 | Good | $1.2 \times 10{-4}$ | Good |
| Inventive Example 2-2 | 90 | 0 | Good | $1.1 \times 10{-4}$ | Good |
| Inventive Example 2-3 | 110 | 0 | Good | $9.4 \times 10{-5}$ | Excellent |
| Inventive Example 2-4 | 130 | 0 | Good | $2.1 \times 10{-4}$ | Fair |
| Inventive Example 2-5 | 150 | 0 | Good | $3.1 \times 10{-3}$ | Poor |

There is a tendency for the adhesion between the inorganic layer 14 and the protective organic layer 16 to increase with increasing drying temperature, that is, heating temperature of the coating material for forming the protective organic layer 16. However, as shown in Table 2, Inventive Examples, in which the drying temperature was appropriate, each have good adhesion and gas barrier properties.

In Inventive Example 2-4 in which the drying temperature was 130° C. and Inventive Example 2-5 in which the drying temperature was 150° C., the drying temperature was too high and the gas barrier properties were deteriorated by the deformation of the support B.

In contrast, in Comparative Example 2-1 in which the drying temperature was too low, the adhesion between the inorganic layer 14 and the protective organic layer 16 was low and a by-product derived from the silane coupling agent remained in the protective organic layer 16 and was released in the form of a gas during the measurement of the moisture vapor transmission rate to deteriorate the gas barrier performance as well.

The above results clearly show the effects of the invention.

What is claimed is:

1. A method for manufacturing a functional film exhibiting gas barrier properties and having a support, and two or more organic layers and one or more inorganic layers alternately formed on the support, the method comprising:
a step of forming an organic layer on the support or on the inorganic layer by a coating process and a step of forming an inorganic layer of a silicon compound by a vapor-phase deposition process, and upon formation of an organic layer overlying the inorganic layer, further comprising a step of exposing a surface of the inorganic layer to air prior to the formation of the organic layer,
wherein the organic layer overlying the inorganic layer is formed using a coating material containing an organic solvent, an organic compound for forming the organic layer, and a silane coupling agent in an amount of 0.1 to 25 wt % in terms of concentration in the coating material exclusive of the organic solvent and containing no pH adjuster by applying the coating material onto the surface of the inorganic layer, then subjecting the coating material on the inorganic layer to heating treatment at a higher temperature than an azeotropic point of by-products due to hydrolysis of the silane coupling agent and the organic solvent or at a higher temperature than a higher one of boiling points of the by-products and the organic solvent and drying the coating material on the inorganic layer, then curing the organic compound.

2. The method according to claim 1, wherein the heating treatment is performed by heating the support from a side on which the organic layer and the inorganic layer are formed and a side on which the organic layer and the inorganic layer are not formed.

3. The method according to claim 1, wherein the heating treatment and the drying of the coating material are performed simultaneously.

4. The method according to claim 1, wherein the coating material used for the formation of the organic layer overlying the inorganic layer contains as the organic compound an organic compound having a higher glass transition temperature than the azeotropic point or the higher one of the boiling points of the by-product and the organic solvent.

5. The method according to claim 1, wherein the coating material contains, as the organic compound for forming the organic layer, either or both of a trifunctional or higher (meth)acrylate monomer and a trifunctional or higher (meth)acrylate oligomer in an amount of 50 wt % or more in terms of the concentration in the coating material exclusive of the organic solvent.

6. The method according to claim 1, wherein the organic compound is cured by either or both of ultraviolet light irradiation and electron beam irradiation.

7. The method according to claim 1, wherein the heating treatment is performed by one or more of hot air heating, heating with a heating roller and heating with a heat exchanger plate.

8. The method according to claim 1, wherein the support is in strip form and is let out from a support roll having the support wound into a roll, application of the coating material to the support, the heating treatment and the drying of the coating material, and curing of the organic compound are performed as the let-out support is conveyed in its longitudinal direction, thereby forming an organic layer, and the support having the organic layer formed thereon is rewound into a roll.

\* \* \* \* \*